United States Patent
Brown

(10) Patent No.: US 6,904,553 B1
(45) Date of Patent: Jun. 7, 2005

(54) DETERMINISTIC TESTING OF EDGE-TRIGGERED LOGIC

(75) Inventor: John Michael Brown, Austin, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 478 days.

(21) Appl. No.: 09/670,855

(22) Filed: Sep. 26, 2000

(51) Int. Cl.⁷ .............................. G01R 31/28
(52) U.S. Cl. ....................... 714/731; 714/729
(58) Field of Search ................. 714/726, 729, 714/731, 724; 324/73.1; 326/16

(56) References Cited

U.S. PATENT DOCUMENTS

| | | | |
|---|---|---|---|
| 4,718,065 A | | 1/1988 | Boyle et al. ............... 371/25 |
| 5,383,143 A | * | 1/1995 | Crouch et al. ............. 708/254 |
| 5,602,855 A | * | 2/1997 | Whetsel, Jr. ............... 714/727 |
| 5,631,911 A | * | 5/1997 | Whetsel, Jr. ............... 714/727 |
| 5,689,517 A | * | 11/1997 | Ruparel ..................... 714/731 |
| 5,694,452 A | | 12/1997 | Bertolet .................... 379/51 |
| 5,717,700 A | * | 2/1998 | Crouch et al. ............. 714/726 |
| 5,719,878 A | * | 2/1998 | Yu et al. ................... 714/726 |
| 6,029,263 A | | 2/2000 | Gibson ..................... 714/726 |
| 6,081,916 A | * | 6/2000 | Whetsel, Jr. ............... 714/727 |
| 6,131,173 A | * | 10/2000 | Meirlevede et al. ......... 714/726 |
| 6,148,425 A | * | 11/2000 | Bhawmik et al. ........... 714/726 |
| 6,418,545 B1 | * | 7/2002 | Adusumilli ................. 714/729 |
| 6,467,044 B1 | * | 10/2002 | Lackey ..................... 713/501 |

OTHER PUBLICATIONS

ASIC Design Methodology Primer, ASIC Products Application Note, IBM, May 1998, http://www.chips.ibm.com/products/asics/document/appnote/231400_0.pdf.

* cited by examiner

Primary Examiner—Albert Decady
Assistant Examiner—Esaw Abraham

(57) ABSTRACT

A digital system having multiple clock domain, each including at least one edge-triggered device, such as a flip-flop, is structured to be submitted to scan testing. Each data path from one clock domain to another includes a latch that is operated by a test clock. During scan testing, when the digital system is logically reconfigured to form one or more scan chains for receiving a test vector, the latches are operated to ensure that the test vector is passed from one domain to another.

25 Claims, 5 Drawing Sheets

DETERMINISTIC TESTING OF EDGE-TRIGGERED LOGIC

BACKGROUND OF THE INVENTION

The present invention relates generally to testing digital logic, and more particularly to a logical and consistent method and mechanism for using scan test techniques to test edge-triggered logic in a manner that resolves timing problems.

Recent advances in integrated circuit fabrication for digital systems has resulted in significant increases in the circuit density. Techniques for testing such high-density integrated circuitry have also advanced in order to be able to provide a credible assessment of the operability of an integrated circuit and systems incorporating integrated circuits. These techniques strive to produce a test methodology that can produce a reliable assessment in a minimum amount of time.

One such test technique enjoying relatively popular use today, sometimes termed "scan testing," involves implanting a digital test state in the circuit under test and allowing it to operate normally before extracting and examining the resultant state. ("Circuit" is used herein to refer to combinations of logic as may be found on an integrated circuit, or on a printed circuit board, or the like.) To do this, the circuit to be tested is constructed to selectively operate in one of two modes: (1) a normal mode in which various flip-flops ("flops") of the circuit (including those flops that are used to construct counters, registers, and the like) function to execute the design of the circuit, or (2) a test mode in which the flops, responsive to a test signal, are interconnected to form one or more long shift registers or "scan chains" for receiving a test pattern, which may be either a pseudo-random pattern or a known test pattern.

Pseudo-random scan testing typically involves placing the circuit in a test mode to form the one or more scan chains referred to above. Then, the scan chain is injected with a pseudo-random test pattern, and the circuit temporarily returned to its normal (non-test) state to allow it to execute at least one normal cycle. The circuit is then returned to the test mode, and the resultant state extracted and combined with other extracted states to form a "test signature." The test signature is compared to a "golden" signature developed, e.g., from running a simulation of good circuit. The compare provides the GO/NO-GO indication of the operability of the circuit. Examples of this technique can be seen in U.S. Pat. Nos. 4,718,065, 5,694,452, and 6,029,263.

At times, a pseudo-random test will not adequately test some portion of the circuit under test. In this case, a data pattern may be crafted to exercise the untested logic.

Another form of scan testing, albeit less robust than full (and potentially at speed) pseudo-random scan tests, is that described by IEEE Standard 1149.1, promulgated by the Joint Test Action Group (JTAG), a collaborative organization comprised of major semiconductor users in Europe and North America. According to this Standard, the architecture will provide for tests that, among other things, can sample various inputs and outputs of the unit under test (external tests), as well as being able to test certain of the internal circuits of the unit under test (internal tests).

Now, it should be evident to those skilled in this art that a hallmark of scan testing is that the test be deterministic and repeatable. This means that a proper operating circuit will produce the same result when tested, regardless of the operating conditions, as long as those conditions are within predetermined parameters. These operating conditions include the manufacturing process variations of the circuit, the test voltage, and the test temperature, all of which influence the logic delay of the circuit under test. Without this feature of determinism, scan testing cannot be relied upon.

An integrated circuit typically includes a number of state machines, each having a number of flops, and each forming a clock domain that is normally asynchronously operated relative to the other click domains. In order to be able to test the entire integrated circuit at once (i.e., without resorting to sequentially testing the circuits within each clock domain), appropriate timing must be established at the interfaces between the clock domains to ensure deterministic operation for testing. Each clock domain will have its own clock distribution network, which meets functional insertion delay and skew requirements according to the application. Skew, in this context, is the difference in arrival times at clocked circuits of what is logically a single clock edge. For example, referring to FIG. 1, there is illustrated a representative integrated circuit, designated generally with the reference numeral 10, with three distinct clock domains 1, 2, and 3. Each clock domain includes at least one edge-triggered flop. Thus, clock domain 1 has at least the flop FF1, clock domain 2 includes at least the flops FF2, FF21, FF22, and clock domain 3 includes flop at least FF3. Each clock domain (1, 2, and 3) may also include combinatorial logic C (C1, C2, and C3, receptively). Data is received by each of the clock domains 1, 2, 3 at PORT 1, PORT 2, and PORT 3 inputs, respectively, while separate and different (and not necessarily synchronous) clocking signals are received at the CLOCK1, CLOCK 2, and CLOCK 3 inputs. Clock domain 2 (i.e., flop FF2) receives, as inputs on signal lines 12 and 14, data outputs from flops FF1 and FF3 of clock domains 1 and 3, respectively, as well as self-synchronous inputs. Flops FF21 and FF22 are employed between the asynchronous domains to bound the arrival time of signals from domains 1 and 3 into domain 2. The logic design of domain 2 must incorporate provision for the metastable behavior of these flops, if the behavior is to be reliable.

It should be noted that domains clocked from the same clock source, but with different clock gating terms, are at best quasi-synchronous. The arrival time of a common logical clock edge happens at unpredictable (but bounded) times in each domain. For example, a gated and a non-gated domain, operating from a common source, will usually have clock trees (circuits which replicate the clock signal(s) to achieve higher drive capability than the original circuit is capable of) with substantially different delays (unless the gating is done at a leaf node of a common distribution tree). This is an invitation to functional short-path problems (timing races) for signals crossing between the domains. This problem is exacerbated when multiple clock inputs, such as CLK1, . . . CLK3 of FIG. 1 are driven by a circuit tester (Tester) which introduces additional uncertainty.

Circuit 10 is controllable only from its primary input ports (PORT 1, PORT 2, PORT 3) and observable only from its primary output ports (not shown). Test coverage is likely to be poor because of low controllability and observability, unless a major investment is made in functional test vector development.

FIG. 2 illustrates modifications to the design of the integrated circuit 10 of FIG. 1 for scan testing. The elements shown in FIG. 2 that are also shown in FIG. 1 use the same reference numerals assigned in FIG. 1. As FIG. 2 shows, the modified circuit (designated with the reference numeral 10') has added a scan data input (SDI), a scan data output (SDO)

and two-input (1, 2) multiplexers M. The multiplexers M provide the circuit 10' with a selectable scan path 20, shown in part by the dotted line, from SDI, through one input (1) of the various multiplexers M, flops FF1–FF3 and combinatorial logic C, to SDO. When this circuit is operated on the circuit tester, clocks CLK1, . . . , CLK3 are synchronously driven by the tester. A test (TEST) input receives a test signal that controls the selections made by the multiplexers M. When the test signal applied to the TEST input is in a first (non-test) state, the multiplexers will set the integrated circuit 10 in its normal, functional state. However, TEST input receives a test signal in a second (test) state, the multiplexers operate to reconfigure the data paths to form a scan path that incorporates the flops (FF1, FF2, FF21, FF22, and FF3, in that order) of the integrated circuit 10', forming the scan chain to receive a test state vector that is shifted into the scan chain from SDI. The test signal is then switched to configure the logic to its functional topology, one or more periods of the clock signals CLK1, . . . , CLK3 applied, and the multiplexers again switched by the test signal to return to the scan configuration for removing the resulting state, which is shifted out (and the next test state shifted in).

Such scan testing requires that the circuitry of the individual clock domains 1,2,3, each of which will contain at least one state machine, operate as a single synchronous unit in order that the scan test results be predictable and repeatable. The functionally disjoint clock trees of each clock domain are fed from a common test clock source when in scan test mode. The interfaces between the clock domains, which were formerly asynchronous, may now have shortpath problems which will cause unreliable/unrepeatable scan test results. This problem arises because, as is conventional, edge-triggered devices will accept and latch data applied to the input on one edge of the applied clock. Thus, it is not entirely certain, for example, whether the prior output of flop e.g. FF1 or the new output is transferred to flop e.g. FF21. The result depends on the order in which Clock 1 is received at FF1 relative to when Clock 2 is received at FF21. This order depends on the summation of delays from a common timing reference point somewhere in the tester to the respective flops. Some of the summation terms (hence the clock arrival times) are not knowable a priori. This condition is not indicative of unreliable functional operation, and is relatively easy to avoid in latch-based designs such as that used by IBM, which tend to avoid a lot of these problems by using a latch-based, two-phase, non-overlapped clock design discipline. A description of a latch-based system may be found in an IBM ASIC Product Applications Note entitled "ASIC Design Methodology Primer", document number SA14-2314-00, 1998.

However, a latch-based design is not the technology of choice for some integrated circuit vendors or some high-speed applications. The vendor preference is often for designs incorporating edge-triggered devices (flops). Designs using edge-triggered devices traditionally require tedious and somewhat unreliable tuning of the clock distribution system if scan testing is to be used. Tuning (adjusting circuit path delays) is tedious because it cannot be done until the clock tree delays are all known. This does not happen until late in the design cycle and the tuning process adds time to the design release process. It is unreliable because it involves attempts to match the largest tree delay (with its large RC component) with a silicon delay, which delays will not track well over process, voltage, and temperature variations.

The model discussed (FIG. 2) is a bit oversimplified, in that it ignores the clock skew problem. This is the problem that the above-mentioned tuning operation attempts to address. The scan path 20 will be well-behaved only if clock skew is less than some maximum value, or if the effects of clock skew are designed out of the path. The clock skew encountered in a the scan test context can result from the tester itself by not delivering nominally simultaneous edges at the same instant. Or, the circuitry of the integrated circuit 10' itself may not delay all clock signals by an equal amount, for any of a number of reasons. Typically, the sizes of typical clock domains can vary from a few dozen flops to many thousands. The clock trees necessary to support those different domain sizes inevitably have widely different delays.

Even within a single clock domain, there may be significant skew due to imbalances in the loading of the clock tree itself. This is true regardless of the attention to detail in the balancing due to across-die variations in propagation delay time for nominally identical circuits.

All this points to a need to be able to reliably and repeatably scan test digital circuitry that used edge-trigger devices incorporated in multiple clock domains.

SUMMARY OF THE INVENTION

The present invention provides a technique of testing logic incorporating edge-triggered devices incorporated in at least two clock domains that resolves timing and skew problems at the operational data crossings of the domains to achieve an integrated circuit architecture that can be subjected to scan testing and provide repeatable, reliable results.

The invention is directed to digital logic having a number of edge-triggered memory devices (e.g., flops) contained in at least two clock domains. The logic is structured to function normally in absence of a scan test signal being asserted, is reconfigurable in response to assertion of the test signal to form one or more scan chains. According to the invention, each operational data path crossing from one clock domain to the other is provided a latch that is clocked by a test clock. Each latch is of a type that is transparent in that it will pass data unimpeded when a signal applied to its clock input is of one of two digital states; and capture and hold data applied to a data input when the signal applied to its clock input is of the other digital state. In effect, the latch is clocked to delay data transfer from one clock domain to another when in test mode.

Accordingly, the digital logic is subjected to conventional scan testing when the scan test signal is asserted, except that the scan test signal is accompanied by a scan clock that is applied to the latches added according to the present invention. A test vector is scanned into the digital logic, and the scan test signal is de-asserted to allow the digital logic to resume its functional configuration. The test clock is then asserted to temporarily freeze (when in one state, e.g., a LOW state) the operational domain crossing interface signals and the logic is allowed to operate normally, for one or more clocks. For each assertion of the functional clocks, the test clock will likewise be cycled. Then, the scan test signal is asserted to again form the scan chain, and the resultant state shifted from the digital logic while a new test vector may be shifted in.

The invention has a number of advantages. First and foremost is the fact that the present invention eliminates, in a systematic manner, the timing uncertainties encountered at the susceptible interfaces in an inexpensive manner. The invention introduces memory elements (latches) whose presence is transparent during functional operation, but whose timing may be simply controlled during test. These latches and the associated clock timing eliminates the timing uncertainties in the test environment without disturbing the functional behavior of the circuit incorporating them.

Additionally, the invention performs under all expected variations of process, voltage, and/or temperature.

Further, the need for tuning the clock trees for test purposes is obviated.

Further still, the invention performs under a specified range of tester-generated clock skew.

In addition, the invention reduces circuit test time by permitting simultaneous testing of logic in all clock domains within the circuit under test.

These and other advantages and aspects of the present invention will become apparent to those skilled in this art upon a reading of the following detailed description of specific embodiments, which should be taken in conjunction with the accompanying drawings.

DESCRIPTION OF THE SPECIFIC EMBODIMENTS

Figure 1:
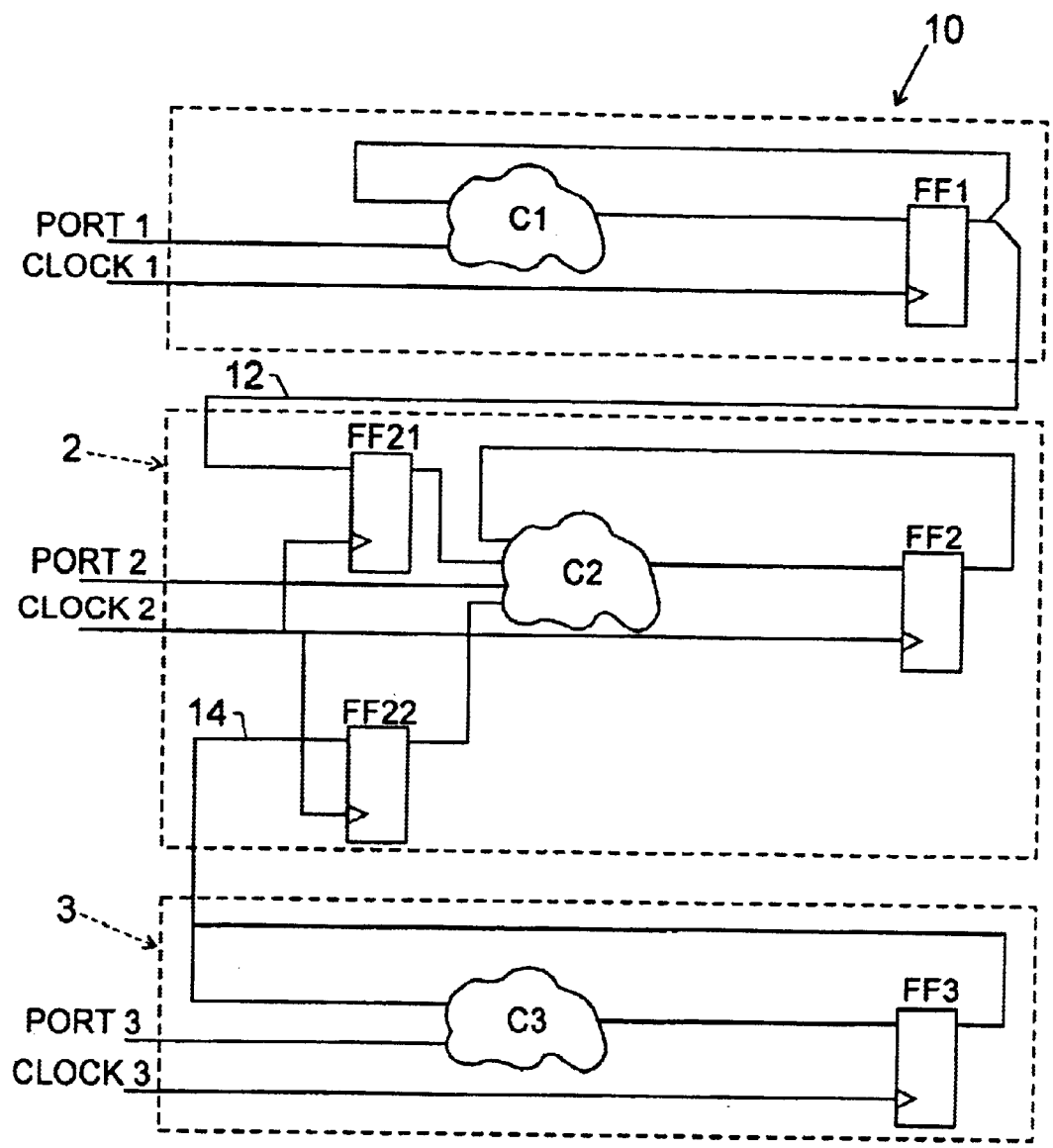
FIG. 1 is an illustrative representation of a prior integrated circuit having three clock domains, each containing at least one edge-triggered device.
Figure 2:
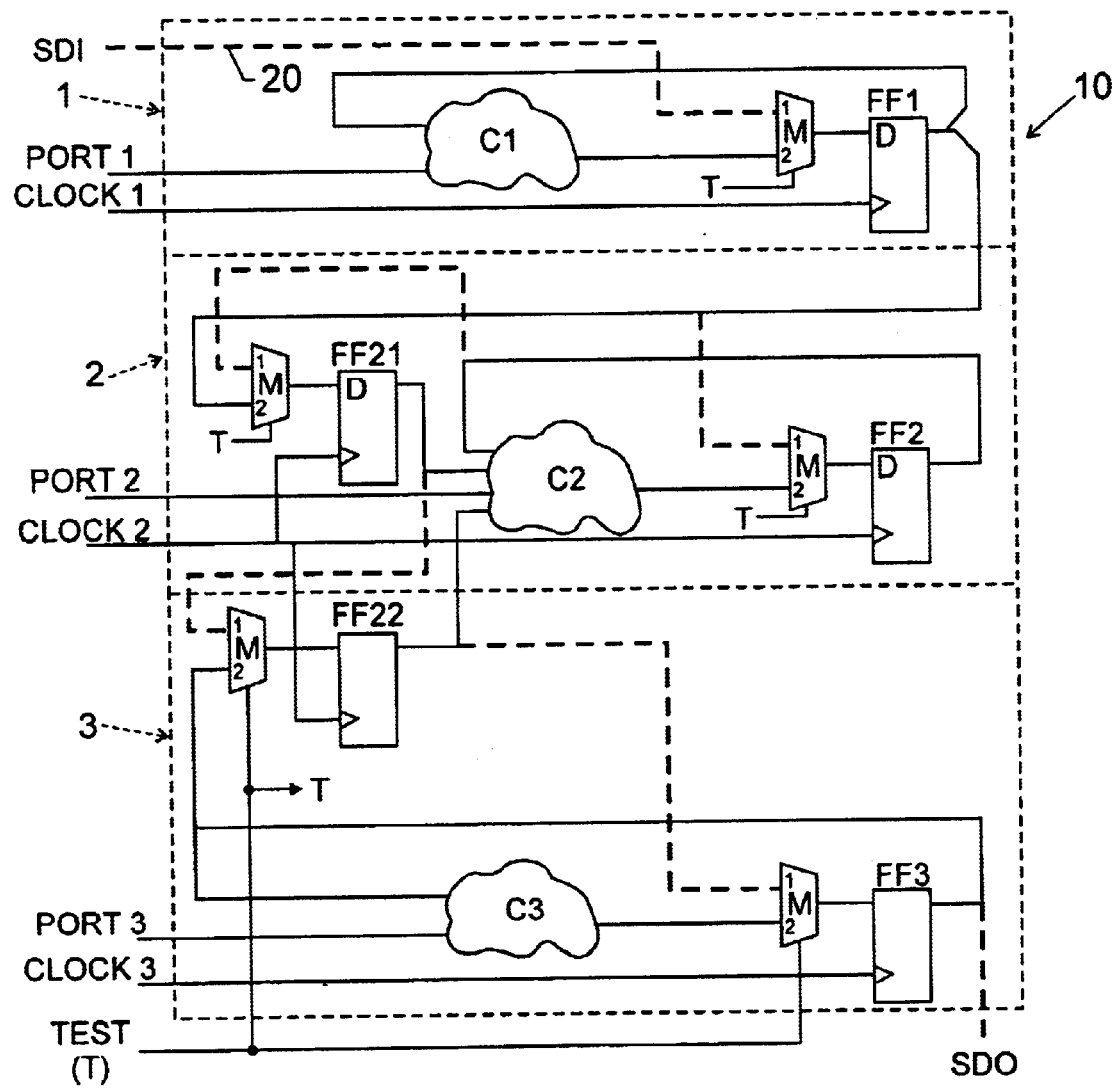
FIG. 2 shows the prior integrated circuit of FIG. 1, modified for scan testing.
Figure 3:
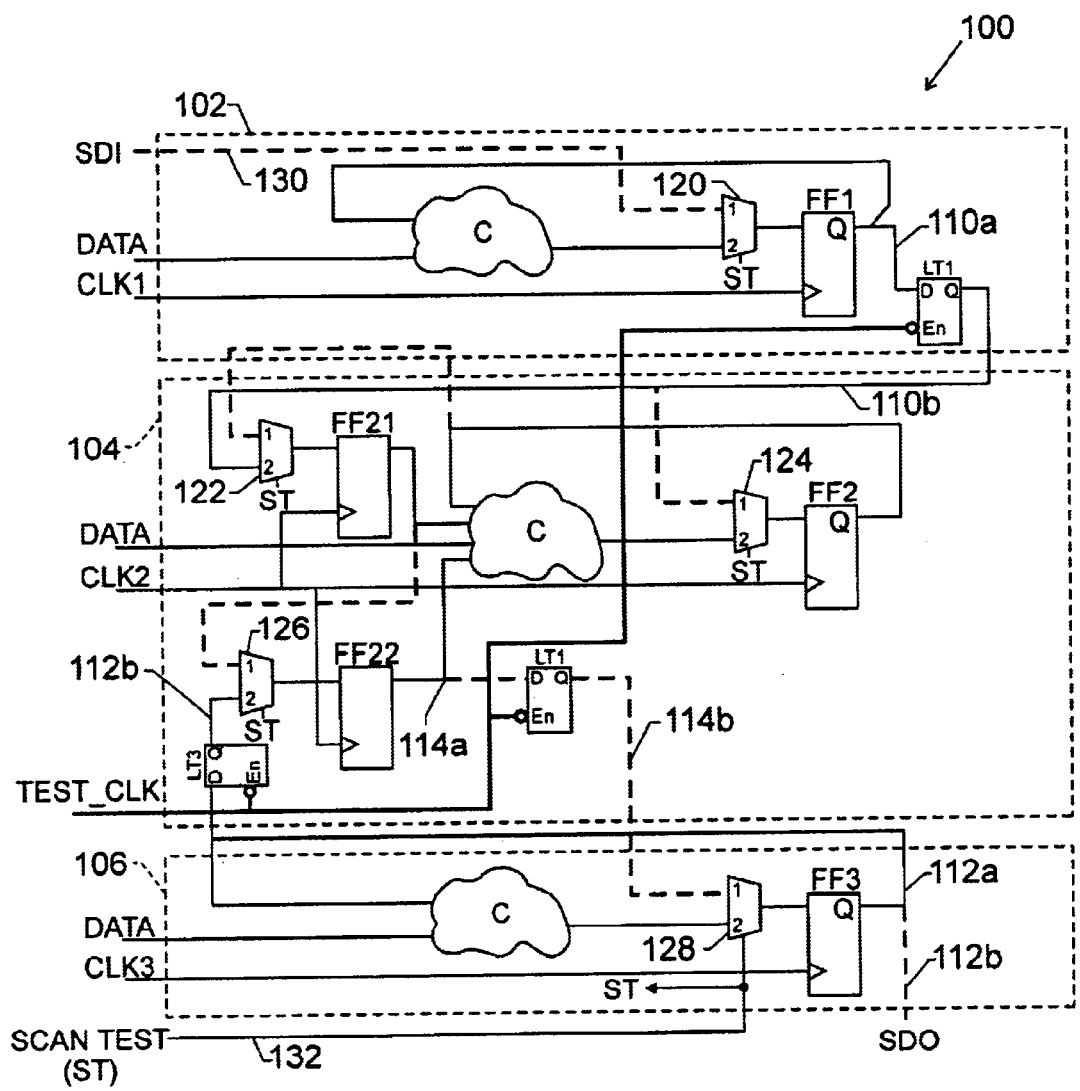
FIG. 3 is a block diagram illustration of a circuit using edge-triggered devices modified to incorporate latches at domain interfaces according to the present invention.

Turning now to FIG. 3, there is illustrated the circuit 100, which is, in effect, a modified version of the circuit 10' of FIG. 2, incorporating an embodiment of the present invention. As FIG. 3 shows, the circuit 100 includes, as did circuit 100, three clock domains 102, 104, and 106. Each clock domain includes data (DATA) and clock (CLK) inputs, combinatoral logic C, and representative clocked, edge-triggered devices such as the flops FF1 (clock domain 102), F2, FF21, and FF22 (clock domain 104), and FF3 (clock domain 106). Multiplexers 120, 122, . . . , 128 are provided in the circuit 100 to allow formation of a selectable scan path between an SDI input on signal line 130 to a SDO output line 112b in response to assertion of a test signal (SCAN TEST (ST) on signal line 132.

When operating normally (i.e., in its functional state), data produced by the flop FF1 of clock domain 102 is communicated from its Q output to the clock domain 104 (as well as back to the combinatorial logic C of clock domain 102) via signal line 110 (110a, 10b), through the latch LT1. In similar fashion, the data output (Q) of the flop FF3 of clock domain 106 is conveyed to the clock domain 104 by the signal line 112a, through latch LT3.

The latches LT1 and LT3 are held in a transparent state during normal operation by holding the test clock, TEST_CLK, in a non-active state, and, therefore, play no part in the functional (non-test) operation of the circuit 100. Timing problems that can occur when passing data from one clock domain to another, each having asynchronous clocking paradigms, are handled by conventional design techniques, such as buffering and the like.

Multiplexers 120, 124, . . . , 128 provide the circuit 100 with data paths that route functional data from source (e.g., FF1) to destination (e.g., FF21) when circuit 100 is operating normally. Assertion of the SCAN TEST signal, however, operates the multiplexers 120, 122, . . . , 128 to select a data path that forms a scan chain for scan testing operation so that scan data introduced to the digital system 100 at the SDI input on signal line 130 is removed from the circuit at Q output of the flop FF3 at the SDO output after application of sufficient clock pulses at clock terminals CLK1, CLK2, and CLK3. The SCAN TEST signal received on signal line 132 is applied to the control (C) input of the multiplexers 120, . . . , 128. When the SCAN TEST signal is in one state (e.g., LOW), each of the multiplexers 120, . . . , 128 is switched to pass functional data. However, when the SCAN TEST signal is asserted (e.g., HIGH), the multiplexers 120, . . . , 128 are put in a state to pass scan data and connect the flops in one or more scan chains (i.e., extended shift register structures).

Data passed from one clock domain to another during scan testing will encounter the timing problems described above due to the skewed nature of the clocking of each such domain. This is true even if the clock signals (CLK) applied to each clock domain are controlled during test—again for reasons stated above. Therefore, in order to ensure that deterministic, reliable, and repeatable signatures and/or results are obtained from running the same scan test on the digital system 100, according to the present invention, the latches LT1, LT2, LT3 are inserted in the data paths that convey data from one domain to another. Each of the latches are clocked by the TEST_CLK signal that becomes a periodic signal during scan testing.

Note that there is no operational data path from the clock domain 104 to the clock domain 106. Although the clock domain 106 could be tested separately from the clock domains 102, 104, and even in parallel, this would require additional test inputs (to bring in test data and clock signals) to be added. Thus, for scan tests, a data path 114b is added in order to include the circuitry of the clock domain 106 in the scan testing of the circuitry of clock domains 102, 104. Again, due to the problems encountered in passing data between different-clock domains, a latch LT2 is added, clocked/enabled by TEST_CLK, and connected to receive the data output of the flop FF22 to pass it to the flop FF3 (via the multiplexer 128).

During normal operation, i.e., when the digital system 100 is functioning as designed, the TEST_CLK signal is in a non-test state to place the latches LT1, LT2 and LT3 in a transparent state. Data is passed by them from the source to the destination with only a small amount of delay. During test, however, the TEST_CLK signal will be periodically placed in a state that causes the data applied to the latches LT1, LT1, and LT3 to be captured and held. The now periodic TEST_CLK signal is operated in relative synchronism with the CLK signals applied to the clock domains 102, 104, and 106, but in a phase that obviates the problems of passing data, now through the latches LT1, . . . , LT3, from one clock domain to another. While the scan test is being conducted, the state of the edge-triggered flops (FF1, FF32, and FF3) that pass data to another clock domain is sampled and held some time prior to the rising edge of TEST_CLK This held-value is clocked (in some other clock domain) by a clock with some large permissible skew relative to the clock in the source domain.

The timing of the TEST_CLK phase is rather noncritical. There simply needs to be enough phase separation to insure hold time at the edge-triggered latches in the face of the circuit and tester skews.

Figure 4A:
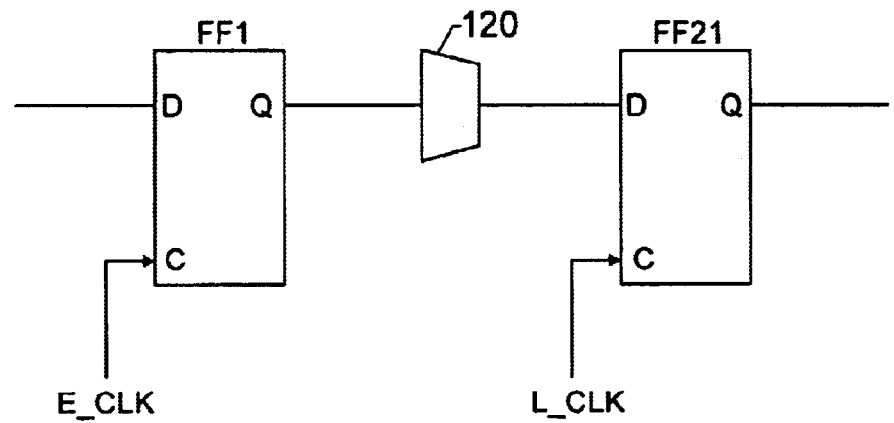
FIG. 4A is a representation of a pair of the edge-triggered devices shown in FIG. 2.
Figure 4B:
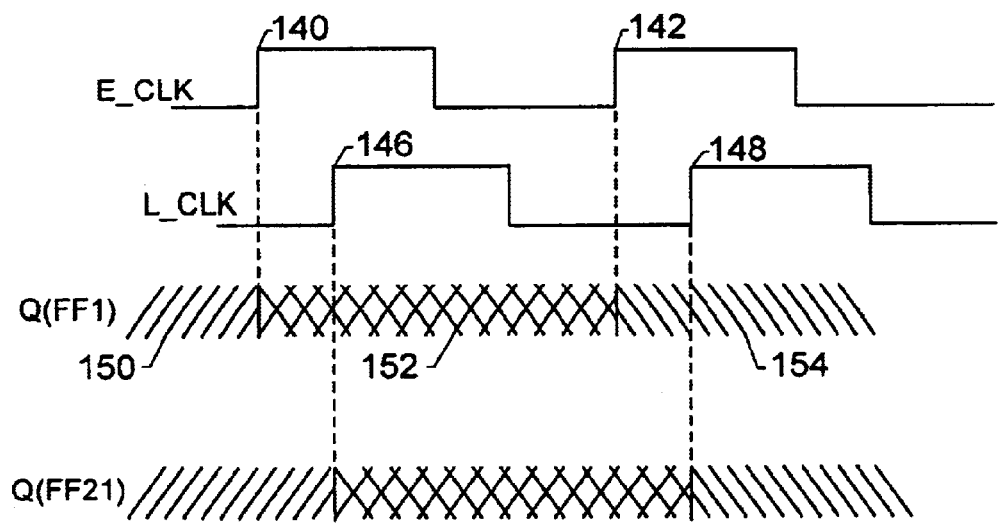
FIG. 4B is a simplified timing diagram, illustrating data transfers from one edge-triggered device of FIG. 4A to the other during testing without the present invention and with an adverse clocking relationship producing incorrect results.
Figure 5A:
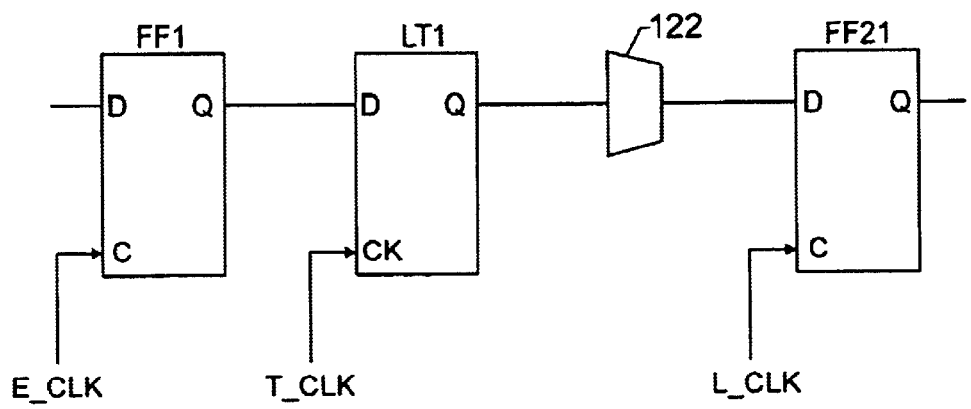
FIG. 5A shows the pair of flops of FIG. 4 with a latch interconnected between them according to the present invention.
Figure 5B:
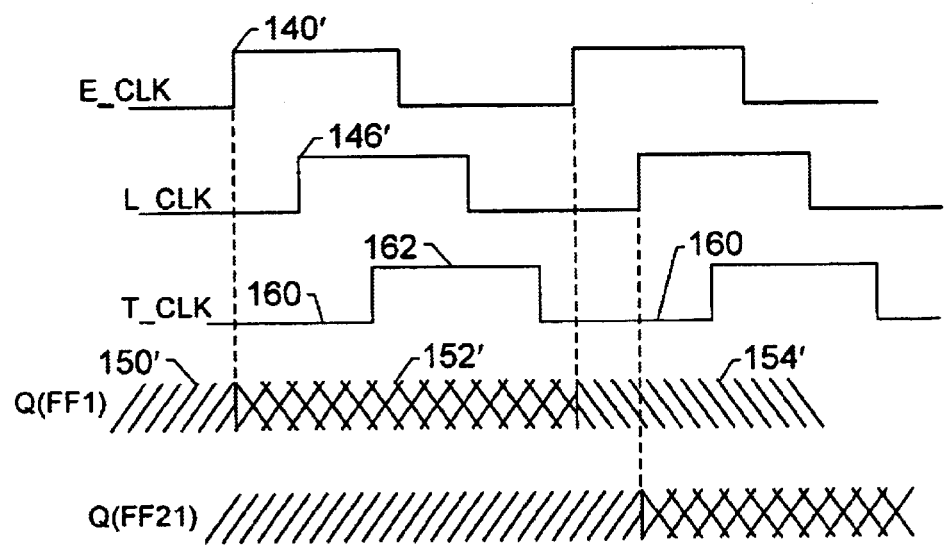
FIG. 5B is a simplified timing diagram illustrating operation of the latch of FIG. 5A according to the present invention, in the like presence of an adverse clocking relationship, but producing correct results.

To better understand the operation of the latches LT1, . . . , LT3, FIGS. 4 and 5 are provided. FIGS. 4A and 4B show the flops FF1 and FF21 and an associated timing diagram, respectively, without the latch LT1. FIGS. 5A and 5B illustrate operation of the flops with the addition of the latch LT1. Referring first to FIG. 4A, shown is the data path formed between the flops that includes the multiplexer 120—as shown also in FIG. 3. Assume that scan testing is initiated, and the clock signals application to the clock inputs (C) of the flops FF1 and F21 are an early clock (E_CLK) and a late clock (L_CLK) so called because the rising or clocking edge of the E_CLK occurs before the clocking or rising edge of the L-CLK. (It will be evident to those skilled in this art that the flops FF1 and FF21, as well as the rest of the flops of circuit 100 of FIG. 3 could be clocked or triggered by the falling edge of the clock signal applied to the C inputs of each.)

Now, assume further that just prior to the rising edge 140 of the E_CLK (FIG. 4B) the flop FF1 holds data that appears at its output (Q) as data 150. At the rising edge 140 of the E_CLK the Q output of the flop FF1 will change to the data 152 by accepting and holding the data applied to its data (D) input. Later, the rising edge 146 of the L_CLK will accept and hold the then output of the flop FF1, i.e., data 152 rather than Data 150, which should be transferred to the flop FF2 1. A faulty data transfer has occurred due to the skew of the clocks. A similar situation occurs at the rising edges 142, 148 of the E_CLK and L_CLK signals, but the damage has been done by the loss of data early on. Of course, depending upon the phase difference between the E_CLK and L_CLK, it could be that proper clocking is achieved sometimes, but not others. This is unacceptable for scan testing, however, which needs the test to produce the same data every time it is run, assuming the circuit under test is properly operating. It is to be noted that the relative timing of E_CLK and L_CLK in this example are within the bounds to be expected of a properly-functioning circuit.

Of course, proper operation for the transfer of data between the flops FF1 and FF21 would occur during testing if the E_CLK followed the L_CLK. Unfortunately, there is no way to ensure that this phasing of the clocks of two different clock domains will be always present at all points of transfer between those domains.

One approach to this problem is to inject the test vector (scan data) with one clock domain provided an early clocking relative to the other clock domains. Then, reload the vector, clocking another of the clock domains early, and so on until all clock domains have been clocked with the early clock. However, this form of testing, by partitioning the test results, significantly increases the time needed to conduct the test due to the multiple reloads of the test vector.

FIGS. 5A and 5B illustrate the solution of the present invention by the addition of the latch LT1. As has been indicated, latch LT1 is of a type that is transparent when one state (e.g., when high) of a clock signal is applied to the clock input (CK), but that captures and holds data by the transition to the other of the two states that the clock signal can assume (e.g., high to low). Thus, referring to FIGS. 5A and 5B, now when the flop FF1 is clocked by the rising edge 140' of the E_CLK, changing the output Q of the flop to the data 152', the flop FF21 does not see the new data; it is blocked by the latch LT1 being held in the capture state by the low state of the TEST_CLK signal. When the flop FF21 is clocked by the rising edge 146' of the L_CLK, it will capture and hold the data supplied by the output Q of the latch LT1—which was the data 150' at the output of the flop FF1 prior to the edge 140'.

Then, when the TEST_CLK signal changes from its low state 160 to its high state 162, the output data of the flop FF1 will be communicated to the flop FF21. That data is captured and held when the TEST_CLK drops again to its low state 160 so that the next transitions of the E-CLK and L_CLK will not have the flops FF1 and FF21 possibly capturing and holding the same data Rather, the flop FF1 captures new data 154 while the flop FF21 captures and holds the data held by the latch LT1, i.e., the data 152' that was previously held by the flop FF1 before the last change. Thus, it can be seen that the transfer of scan data across the clock domains is accomplished in an ordered fashion so that the scan testing is not affected by timing differences between the domains.

The TEST_CLK operates the latches (LT1, . . . , LT3), during test mode, to hold the domain crossing interface signals while the logic upstream and downstream of the latch changes state (to capture signals applied to each). This application of latches to the operational paths to solve clock skew problems in test mode is one of the novel features of the invention.

The timing of the TEST_CLK during a test is relatively uncritical, as long as its low to high transition is later than the latest of the clocking edges of clocks (CLK1, . . . , CLK3) applied to each of the clock domains 102, . . . , 106, respectively, and the high to low transition is earlier than the earliest of the clocking edges of CLK1, . . . , CLK3. In addition, the TEST_CLK preferably has sufficient width to ensure reliable operation of the latch LT1.

Of course, the description and discussion concerning the insertion of the latch LT1 in the data path between the flops FF1 and FF21 of the clock domains 102, 104 will apply also to an data path between any of the clock domains 102, . . . , 106 between an edge-triggered device in one domain and an edge-triggered device in the other, such as the latches LT2 and LT3.

What is claimed is:

1. A method for deterministic testing of edge-triggered logic, the method comprising:

setting a test signal in a test state so as to form a first scan chain that is responsive to a logic transition of a first clock signal and a second scan chain that is responsive to a logic transition of a second clock signal, the first and second scan chains each having an input for receiving scan data and an output for respectively providing the scan data; and operating a third clock to control a latch interposed between the output of the first scan chain and the input of the second scan chain causing the latch to experience a hold state or a follow state, the hold state being experienced during a time period prior to the logic transition of the first clock signal and subsequent to the logic transition of the second clock signal such that data present at the output of the first scan chain prior to the logic transition of the first clock signal is held in the latch until after the logic transition of the second clock, the follow state being experienced outside the time period.

2. A circuit comprising:
a first clock domain comprising:
- a first edge triggered memory device configured to receive a first data input signal, and configured to produce a first output signal in response to a first clock signal;
- a first latch configured to receive the first output signal from the first edge triggered memory device and configured to produce a second output signal in response to a test clock signal;
- combinatorial logic configured to receive each of a functional data signal and the second output signal from the first latch and configured to produce a combinatorial logic output signal; and
- a multiplexor configured to receive each of the combinatorial output signal and a scan data input signal;

a second clock domain configured to receive the second output signal from the first clock domain and comprising:
- a second edge triggered memory device configured to receive a second data input signal, and configured to produce a third output signal in response to a second clock signal; and
- a second latch configured to receive the third output signal from the second edge triggered memory device and configured to produce a fourth output signal in response to the test clock signal.

3. The circuit, as set forth in claim 2, wherein each of the first edge triggered memory device and the second edge triggered memory device comprises a flip flop.

4. The circuit, as set forth in claim 2, wherein the first data input signal comprises one of a scan data input signal and a functional data input signal.

5. The circuit, as set forth in claim 2, wherein the second clock domain is configured to receive the second output signal from the first latch at a multiplexor.

6. The circuit, as set forth in claim 2, comprising a third clock domain configured to receive the fourth output signal from the second latch.

7. The circuit, as set forth in claim 6, wherein the third clock domain comprises:
- a multiplexor configured to receive the fourth output signal from the second latch;
- a third edge triggered memory device configured to receive a third data input signal from the multiplexor, and configured to produce a fifth output signal in response to a third clock signal; and
- combinatorial logic configured to receive each of a functional data signal and the fifth output signal from the third edge triggered device and configured to produce a combinatorial logic output signal, wherein the combinatorial output signal is delivered to the multiplexor.

8. The circuit, as set forth in claim 2, wherein the first latch is configured to produce the second output signal at approximately the same time as the second latch produces the fourth output signal.

9. A circuit comprising:
a plurality of clock domains, wherein each of the plurality of clock domains is coupled to another of the plurality of clock domains via a test path and is configured to receive a respective functional data signal and a respective clock signal and wherein each of the plurality of clock domains comprises:
- a test clock input for receiving a test clock;
- a test data input for receiving test data;
- a test data output for producing output data; and
- a test selection input for enabling a test mode; and
- a plurality of inter-domain test latches arranged in the test path, wherein each of the plurality of inter-domain test latches is configured to pass data when the test clock is in a first state and configured to hold data when the test clock is in a second state.

10. The circuit, as set forth in claim 9, wherein each of the plurality of clock domains comprises a flip flop configured to receive the test data and configured to output the test data in response to the respective clock signals received at each of the plurality of domains.

11. The circuit, as set forth in claim 9, wherein each of the plurality of clock domains is configured to operate in the test mode when the test selection input is asserted and configured to operate in a functional mode when the test selection input is in a second state.

12. The circuit, as set forth in claim 9, wherein each of the plurality of clock domains comprises a multiplexor configured to receive the test selection input for enabling the test mode.

13. The circuit, as set forth in claim 9, wherein the plurality of clock domains comprises:
- a first clock domain configured to receive a first clock signal;
- a second clock domain configured to receive a second clock signal; and
- a third clock domain configured to receive a third clock signal.

14. The circuit, as set forth in claim 9, wherein the plurality of inter-domain test latches are configured to connect each of the plurality of domains when the circuit is in the test mode.

15. The circuit, as set forth in claim 9, wherein each of the plurality of inter-domain test latches is configured to produce a respective output at approximately the same time when the test mode is enabled.

16. A method of testing a circuit comprising a plurality of clock domains each configured to receive a respective clock signal, wherein the circuit is configured to operate in a test mode when a test mode signal is asserted and configured to operate in a functional mode when the test mode signal is de-asserted comprising:
executing a first shift cycle in the circuit, wherein executing the shift cycle comprises:
- asserting a test mode signal, wherein assertion of the test mode signal configures a first edge-triggered device to receive test data from a test data input and configures each of a plurality of second edge-triggered devices in the system to receive data serially from a respective one of the first and the plurality of second edge-triggered devices;
- de-asserting the respective clock signals to each of the respective clock domains;
- simultaneously asserting each of the respective clock signals to shift the test data into the first edge-triggered device; and
- de-asserting the test mode signal, such that the circuit operates in the functional mode; and executing a sample cycle in the circuit, wherein executing the sample cycle comprises:
- de-asserting each of the respective clock signals;
- delivering test data to the first edge-triggered device;
- de-asserting the test mode signal, thereby placing the circuit in the functional mode;
- delivering test data to the first edge-triggered device and each of the plurality of second edge-triggered devices;

asserting the test clock to hold data on an output of each of the plurality of latches and at an input of each of the plurality of second edge-triggered devices; and simultaneously asserting each of the respective clock signals.

17. The method, as set forth in claim 16, comprising executing a second shift cycle.

18. The method, as set forth in claim 17, wherein a scan data output produced during the first shift cycle is compared to a scan data output produced during the second shift cycle.

19. A circuit comprising:

a first clock domain comprising:
   a first edge triggered memory device configured to receive a first data input signal, and configured to produce a first output signal in response to a first clock signal; and
   a first latch configured to receive the first output signal from the first edge triggered memory device and configured to produce a second output signal in response to a test clock signal;

a second clock domain configured to receive the second output signal from the first clock domain and comprising:
   a second edge triggered memory device configured to receive a second data input signal, and configured to produce a third output signal in response to a second clock signal; and
   a second latch configured to receive the third output signal from the second edge triggered memory device and configured to produce a fourth output signal in response to the test clock signal,
   wherein the second clock domain is configured to receive the second output signal from the first latch at a multiplexor.

20. The circuit, as set forth in claim 19, wherein each of the first edge triggered memory device and the second edge triggered memory device comprises a flip flop.

21. The circuit, as set forth in claim 19, wherein the first data input signal comprises one of a scan data input signal and a functional data input signal.

22. The circuit, as set forth in claim 19, wherein the first clock domain comprises:
   combinatorial logic configured to receive each of a functional data signal and the second output signal from the first latch and configured to produce a combinatorial logic output signal; and
   a multiplexor configured to receive each of the combinatorial output signal and a scan data input signal.

23. The circuit, as set forth in claim 19, comprising a third clock domain configured to receive the fourth output signal from the second latch.

24. The circuit, as set forth in claim 23, wherein the third clock domain comprises:
   a multiplexor configured to receive the fourth output signal from the second latch;
   a third edge triggered memory device configured to receive a third data input signal from the multiplexor, and configured to produce a fifth output signal in response to a third clock signal; and
   combinatorial logic configured to receive each of a functional data signal and the fifth output signal from the third edge triggered device and configured to produce a combinatorial logic output signal, wherein the combinatorial output signal is delivered to the multiplexor.

25. The circuit, as set forth in claim 19, wherein the first latch is configured to produce the second output signal at approximately the same time as the second latch produces the fourth output signal.

* * * * *